United States Patent [19]

Miyagawa et al.

[11] Patent Number: 5,730,889
[45] Date of Patent: Mar. 24, 1998

[54] INK JET RECORDING HEAD, FABRICATION METHOD THEREOF, AND PRINTER WITH INK JET RECORDING HEAD

[75] Inventors: Masashi Miyagawa; Norio Ohkuma; Genji Inada, all of Yokohama, Japan

[73] Assignee: Canon Kabushiki Kaisha, Tokyo, Japan

[21] Appl. No.: 813,997

[22] Filed: Mar. 10, 1997

Related U.S. Application Data

[63] Continuation of Ser. No. 534,883, Sep. 27, 1995, abandoned, which is a continuation of Ser. No. 69,848, Jun. 1, 1993, abandoned.

[30] Foreign Application Priority Data

Jan. 6, 1992 [JP] Japan ................................ 4-140682
May 6, 1992 [JP] Japan ................................ 4-145590

[51] Int. Cl.$^6$ .................................................. B41J 3/00
[52] U.S. Cl. ......................... 216/27; 216/33; 216/49; 216/56
[58] Field of Search .......................... 216/27, 33, 36, 216/49, 56

[56] References Cited

U.S. PATENT DOCUMENTS

| | | | |
|---|---|---|---|
| 4,313,124 | 1/1982 | Hara | 346/140 R |
| 4,345,262 | 8/1982 | Shirato et al. | 346/140 R |
| 4,459,600 | 7/1984 | Sato et al. | 346/140 R |
| 4,463,359 | 7/1984 | Ayata et al. | 346/1.1 |
| 4,558,333 | 12/1985 | Sugitani et al. | 346/140 R |
| 4,608,577 | 8/1986 | Hori | 346/140 R |
| 4,609,427 | 9/1986 | Inamoto et al. | 156/633 |
| 4,723,129 | 2/1988 | Endo et al. | 346/1.1 |
| 4,740,796 | 4/1988 | Endo et al. | 346/1.1 |
| 5,030,317 | 7/1991 | Noguchi | 156/630 |
| 5,126,768 | 6/1992 | Nozawa et al. | 156/630 X |

FOREIGN PATENT DOCUMENTS

| | | |
|---|---|---|
| 0432795 | 6/1991 | European Pat. Off. |
| 3735372 | 10/1987 | Germany . |
| 54-056847 | 5/1979 | Japan . |
| 57-208255 | 12/1982 | Japan . |
| 57-208256 | 12/1982 | Japan . |
| 59-123670 | 7/1984 | Japan . |
| 59-138461 | 8/1984 | Japan . |
| 60-071260 | 4/1985 | Japan . |
| 61-154947 | 7/1986 | Japan . |
| 4-152144 | 5/1992 | Japan . |
| 4-310750 | 11/1992 | Japan . |
| 4-312854 | 11/1992 | Japan . |

OTHER PUBLICATIONS

Eur. Pat. Off. Search Report for Eur. Pat. Appln. No. 93108683.9.

*Primary Examiner*—William Powell
*Attorney, Agent, or Firm*—Fitzpatrick, Cella, Harper & Scinto

[57] ABSTRACT

A method of fabricating an ink jet recording head includes forming a photosensitive resin layer on a substrate having formed thereon an energy generation device for generating energy for ejecting recording droplets; pattern-wise exposing the photosensitive resin layer to an active radiation to a portion of the photosensitive resin layer where formation of a pattern of an ink fluid path is desired; laminating a top plate on the photosensitive resin layer; and eluting the pattern exposed portion of the photosensitive resin layer to form a pattern of an ink fluid path. An ink jet recording head includes a substrate a substrate; an energy generation device provided on the substrate and for generating energy for ejecting recording droplets; an exposed photosensitive resin layer provided on the substrate, the resin layer comprising a heat-crosslinking positive type resist material, and being provided with an ink fluid path defined between the substrate and the exposed photosensitive resin layer; a top plate laminated on the exposed photosensitive layer, the top plate being provided with an ink supply port communicating with the ink fluid path; and the ink fluid path ending as an ink ejection port on a side opposite to a side of the ink supply port. An ink jet recording apparatus includes a portion for mounting such an ink jet recording head.

27 Claims, 4 Drawing Sheets

INK JET RECORDING HEAD, FABRICATION METHOD THEREOF, AND PRINTER WITH INK JET RECORDING HEAD

This application is a continuation of application Ser. No. 08/534,883, filed Sep. 27, 1995, which was a continuation of application Ser. No. 08/069,848, filed Jun. 1, 1993, both now abandoned.

BACKGROUND OF THE INVENTION

1. Field of the Invention

The present invention relates to an ink jet recording head, and to a method for fabricating such a head, as well as a printer including the head. More particularly, the present invention relates to an ink jet recording head for generating recording droplets, and to a method for fabricating that head as well as to a printer including the head.

2. Description of the Prior Art

An ink jet recording head applied to an ink jet recording system (fluid spray recording system) generally includes a fine recording fluid ejection port, a fluid path and an energy generation device which is provided in a part of the fluid path and supplies energy for ejecting recording fluid. Conventionally, as a method for fabricating such a fluid spray recording head, there has been known, for example, a method in which a glass or metal plate is formed with fine groove by processing such as cutting or etching, and the plate with the groove is coupled with another suitable plate to form a fluid path.

However, the fluid spray recording head fabricated by the conventional method have various problems such as difficulty is obtaining a fluid path having a constant path resistance because the inner walls of the fluid path formed by cutting are too coarse in surface roughness or strain occurs in the inner walls due to a difference in their etching rate, which leads to variation in the recording characteristics of the fabricated fluid spray recording head. In addition, upon cutting, the substrate tends to be broken or cracked, thus decreasing yield of products. In the case of etching, this processing involves many fabrication steps, resulting an increased fabrication cost. Further, a problem common to the conventional methods is that it is difficult to align the top plate formed with a fluid path with the cover plate having provided thereon a driving device, such as a piezo electric device or electro-thermal transducer, which generates energy for ejecting recording fluid droplets when these plates are bonded, thus lacking large-scale productivity.

Under its use conditions, the fluid spray recording head usually is always in contact with a recording fluid (generally an ink fluid comprising water as a main component and being non-neutral, an ink fluid comprising an organic solvent as a main component, or the like). Hence, it is desired that the material of the head in the fluid spray recording head, on one hand, does not suffer from a decrease in strength due to influence by the recording fluid, and on the other hand, does not give or release into the recording fluid an injurious component which will deteriorate recording characteristics. In the conventional methods, however, materials which satisfy the aforementioned objects cannot always be selected because of limitation on processing methods, etc.

In order to overcome the aforementioned problems, a method has been proposed in which there is, on a substrate having formed thereon an energy generation device, formed by pattern formation a nozzle including an ink fluid path and an orifice portion made of a photosensitive resin material as disclosed in any of Japanese Patent Laying-Open Nos. 208255/1982 and 208256/1982, and a glass plate or the like cover plate is bonded thereto.

However, this method has problems which follows.

(1) The adhesive for bonding the top plate flows in the ink fluid path, resulting in that the ink fluid path is deformed.

(2) Upon cutting the substrate for forming the ink ejection port, cutting dust comes in the ink fluid path to make ejection of ink unstable.

(3) Since the substrate formed with the ink fluid path, i.e., a void portion, is cut, the ink ejection port formed by cutting tends to be broken partly.

These problems not only decrease yield of fabrication of fluid spray recording head but also make it difficult to fabricate a fluid spray recording head which is long and has a long, fine ink fluid path and a plurality of ink ejection ports.

In the method disclosed in Japanese Patent Application Laying-Open No. 154947/1986, which is intended to obviate the aforementioned problem, an ink fluid path portion formed with a soluble resin is covered with a resin or the like, and after cutting the substrate, the soluble resin is dissolved to form a pattern of an ink fluid path. This method has a problem of an increase in the cost of fabricating a fluid spray recording head since it involves a step of forming an ink fluid path portion with a soluble resin, a step of forming a resin layer covering the ink fluid path portion, and a step of curing the resin.

SUMMARY OF THE INVENTION

With view to obviating the aforementioned problems, intensive investigation has been made.

It is an object of the present invention to provide an ink jet recording head having mounted thereon nozzles at high density which is low in cost and with high precision as well as high reliance and high resolution, and a method of fabricating such an ink jet recording head.

Another object of the present invention is to provide an ink jet recording head having an ink fluid path finely processed with high precision and high yield and a method of fabricating such an ink jet recording head.

Still another object of the present invention is to provide an ink jet recording head which is less susceptible to interaction with a recording fluid, and has excellent mechanical strength and resistance to chemicals, and a method of fabricating such an ink jet recording head.

As a result of intensive investigation, it has now been found that the above objects can be achieved by the use of a photosensitive resin.

According to a first aspect of the present invention, there is provided a method of fabricating an ink jet recording head, comprising the steps of: forming a photosensitive resin layer on a substrate having formed thereon an energy generation device for generating energy for ejecting recording droplets; pattern-wise exposing the photosensitive resin layer to an active radiation to a portion of the photosensitive resin layer where formation of a pattern of an ink fluid path is desired; laminating a top plate on the photosensitive resin layer; and eluting the pattern exposed portion of the photosensitive resin layer to form a pattern of an ink fluid path.

Here, the photosensitive resin layer may be formed with a negative type resist.

The negative type resist may have a weight average molecular weight within the range of 5,000 to 30,000.

The photosensitive resin layer may be formed with a positive type photoresist.

The positive photoresist may contain an amine.

The positive type photoresist may contain a novolak resin and an sulfonic acid ester of a quinonediazide compound.

The photosensitive resin layer may be formed with a heat-crosslinking positive type resist.

According to a second aspect of the present invention, there is provided with an ink jet recording head comprising: a substrate; an energy generation device provided on the substrate and for generating energy for ejecting recording droplets; an exposed photosensitive resin layer provided on the substrate, the resin layer comprising a heat-crosslinking positive type resist material, and being provided with an ink fluid path defined between the substrate and the exposed photosensitive resin layer; a top plate laminated on the exposed photosensitive layer, the top plate being provided with an ink supply port communicating with the ink fluid path; and the ink fluid path ending as an ink ejection port on a side opposite to a side of the ink supply port.

According to a third aspect of the present invention, there is provided with an ink jet recording apparatus, comprising:

a portion for mounting an ink jet recording head, the ink jet recording head including: a substrate; an energy generation device provided on the substrate and for generating energy for ejecting recording droplets; an exposed photosensitive resin layer provided on the substrate, the resin layer comprising a heat-crosslinking positive type resist material, and being provided with an ink fluid path defined between the substrate and the exposed photosensitive resin layer; a top plate laminated on the exposed photosensitive layer, the top plate being provided with an ink supply port communicating with the ink fluid path; and the ink fluid path ending as an ink ejection port on a side opposite to a side of the ink supply port.

The present invention has the following advantages.

1) Since main steps of fabricating the recording head use lithography technique using a photoresist, photosensitive dry film or the like, most fine part of the head can be formed in a desired pattern very easily, and it is easy to process many recording heads of the same construction simultaneously.

2) Since the ink fluid path is formed after bonding of the top plate, a good ink jet recording head an be fabricated that is free of dripping of the ink in the ink fluid path or peeling-off of the top plate.

3) An ink jet recording head can be fabricated which can realize a good setting without cutting dust, grinding agent or the like coming in the ink fluid path.

4) Since the cutting of the substrate is performed in a state where the portion to be processed into an ink fluid path is filled with the resist, the substrate is not broken upon the cutting.

5) In a negative type resist, limitation of molecular weight of the resist prevents the occurrence of scum or development residue, and enables rapid development of resist.

6) In a positive type resist, there occurs no scum or residue upon development, and the use of an image reverse method or use of a reaction product between a novolak resin and a quinonediazide compound prevent broadening of the pattern or decrease in film thickness upon development.

7) In the case where a heat-crosslinking positive type resist is used for forming an ink fluid path, dissolution of unexposed portion does not occur even when the resist is dipped in a developer having a high resolution such as an organic solvent, resulting in that ink jet recording heads having a uniform quality can be fabricated. Also, ink jet recording heads can be fabricated that have excellent mechanical strength, solvent resistance, and heat resistance.

8) High density multi-array ink jet recording heads can be obtained by simple means.

9) Ink jet recording heads can be fabricated at low cost without needs for new investment for installment since only the order of the development of a photosensitive resin pattern in the conventional method of fabrication an ink jet recording head.

The above and other objects, effects, features and advantages of the present invention will become more apparent from the following description of embodiments thereof taken in conjunction with the accompanying drawings.

DESCRIPTION OF PREFERRED EMBODIMENTS

Hereinafter, the present invention will be described with reference to accompanying drawings where necessary.

FIGS. 1 to 6 are schematic views showing an example of the method for fabricating an ink jet recording head according to a basic embodiment of the present invention. While in this embodiment, fabrication of an ink jet recording head having two orifices is described, high density multi-array ink jet recording head can be fabricated similarly.

Figure 1:
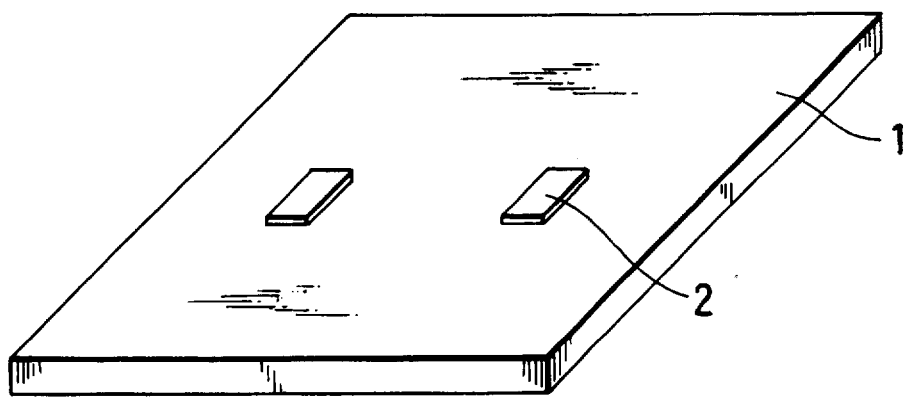
FIG. 1 is a schematic perspective view showing a substrate on which an energy generation device is arranged.

In this embodiment, a substrate made of glass, ceramics, plastic, metal or the like as shown in FIG. 1 is provided. FIG. 1 is a schematic perspective view showing such a substrate 1 before a photosensitive material layer is formed.

The substrate 1 functions as a part of an ink fluid path component member. The substrate 1 is not limited particularly, and may be of any material or shape so far as it can serve as a support for a photosensitive resin layer. On the substrate 1 is arranged an energy generation device 2 such as an electro-thermal transducer or a piezoelectric device in a desired number. In FIG. 1, two such energy generation devices are arranged. The energy generation devices 2 give energy to an ink fluid so that the ink fluid can be ejected as recording fluid droplets. For example, when electro-thermal transducers are used as the energy generation devices 2, the ink fluid near the devices 2 is heated to generate ink ejection energy. On the other hand, when piezoelectric devices are used as the energy generation devices 2, ink ejection energy is generated by mechanical oscillation of the devices 2.

These devices are connected to an electrode (not shown) for inputting a control signal for operating the devices. Generally, to increase durability of the energy generation devices 2, various functional layers such as a protection layer may be provided, and in the present invention, one or more such functional layers may be provided too.

Figure 2:
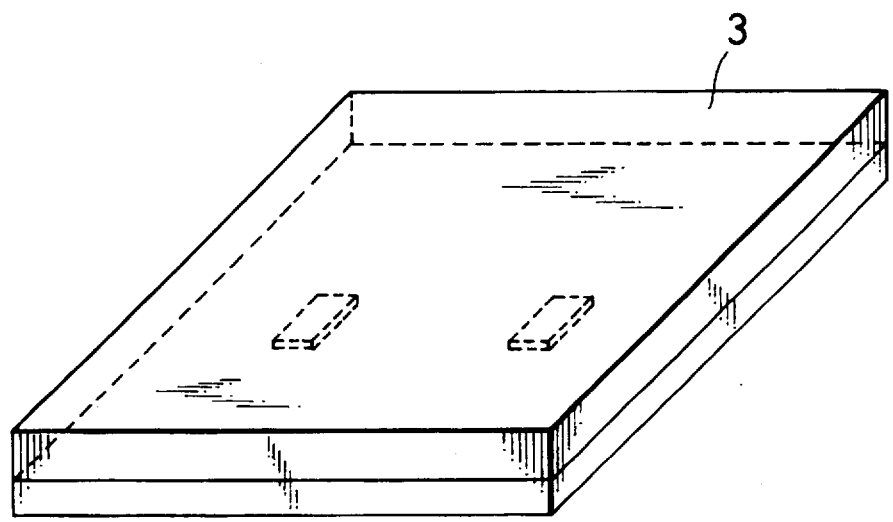
FIG. 2 is a schematic perspective view showing a substrate on which a heat-crosslinking positive resist layer is formed.

Next, as shown in FIG. 2, a photosensitive resin layer 3 is formed on the substrate 1. Thus, the photosensitive resin layer embeds the energy generation devices 2 therein. Either a negative or positive type resist material may be used to form a photosensitive resin layer. The photosensitive resin layer 3 may be formed by coating a solution of a photosensitive resin material on the substrate 1 by a solvent coating method, or by laminating a dry film coated thereon a photosensitive resin material on the substrate 1.

Figure 3:
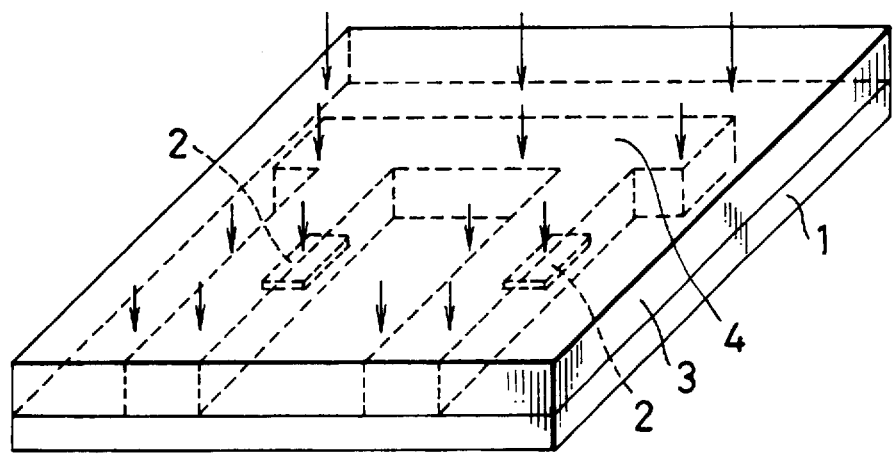
FIG. 3 is a schematic perspective of a substrate with a heat-crosslinking positive resist layer thereon which is subjected to pattern exposure.

The photosensitive resin layer 3 thus formed is subjected to pattern-wise exposure as shown in FIG. 3 to imagewise or pattern-wise expose a radiation exposure portion 4 where an ink fluid path is to be formed to a radiation indicated by arrows in FIG. 3. The exposure may be a flush exposure through a photomask having a pattern of an ink fluid path, or direct scanning of an electron beam or ion beam. An exposure radiation source may be any of deep-UV rays, excimer laser beam, electron beam, X-rays, etc. so far as it enables patterning of the photosensitive resin layer 3.

Figure 4:
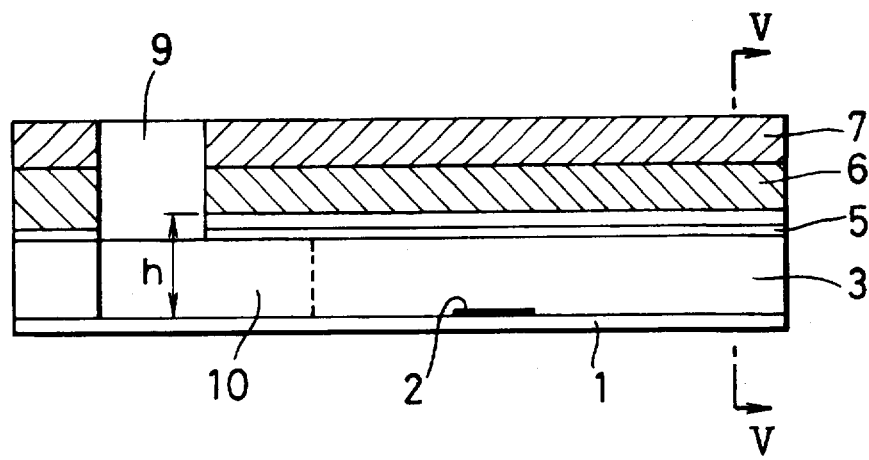
FIG. 4 is a schematic cross-sectional view showing an integrated substrate on which a top plate is bonded.

Then, as shown in FIG. 4, a top plate 7 is bonded onto the photosensitive resin layer 3 of which the radiation exposure portion 4 designed to give an ink fluid path has been pattern-wise exposed to a radiation. The top plate 7 may be made of any material such as ceramics, e.g., glass, a metal, a resin, etc. The top plate 7 is formed with an adhesive layer 5 through a top plate resin layer 6. In this case, it is sufficient to coat the adhesive on a region other than the radiation exposure portion 4. An ink supply port 9 is provided through the top plate 7 and the top plate resin layer 6. In particular, since the adhesive does not flow down into the ink fluid path according to the present invention, the top plate 7 need not be a member with high precision in its surface flatness, resulting in a reduction in cost.

As shown in FIG. 4, in order to decrease ink fluid path resistance between the ink supply port 9 and the energy generation devices 2, the top plate 7 may be provided with a pattern so that the height, h, of the ceiling of the ink fluid path between the ink supply port 9 and the energy generation devices 2 can be made large enough. As the adhesive, there can be used any conventional heat-curing adhesive, photosensitive adhesive, or pressure-sensitive adhesive.

Sometimes, use of a photosensitive adhesive as a material for the adhesive layer 5 is limited since the photosensitive adhesive layer 3 which has been pattern-wise exposed to transfer the ink fluid path pattern is also sensitive to light or radiation used for curing the adhesive layer 5. That is, the use of a photosensitive adhesive as a material for the adhesive layer 5 is allowed only when exposure operations for curing the photosensitive adhesive give no influence on the photosensitive resin layer 3 to which the ink fluid path pattern has been transferred, for example, in the cases where the resin forming the ink fluid path pattern is a resin sensitive to high energy radiation such as ionizing radiation, where the photosensitive adhesive has a different photosensitive wavelength region, or a sensitivity different enough to give no influence to the ink fluid path pattern, where a member or element which prevents transmission of light or radiation is provided by vapor deposition or sputtering on the surface of the resin to which the ink fluid path pattern image has been transferred, etc.

Figure 5:
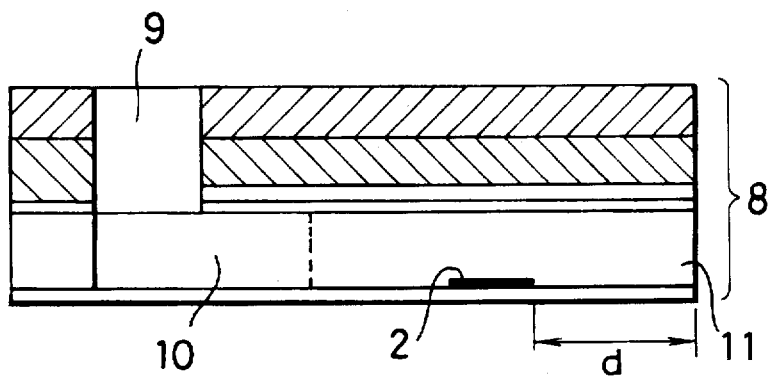
FIG. 5 is a schematic cross-sectional view showing an integrated substrate with a top plate, with an end of the integrated substrate being cut.

Next, as shown in FIG. 5, the substrate 1 is cut. That is, the laminate or integrated substrate 1 is cut along the line v—v in FIG. 4 to give a cut surface 8. The cutting may be performed by using a mechanical means such as a dicing saw, or by an optical processing such as irradiation of a laser beam. After the cutting, the cut surface 8 may be further cut or ground so that precision in distance, d, between an ink ejection port 11 and the energy generation devices 2 can be increased. In the present invention, the ink fluid path portion is undeveloped when the substrate 1 is cut, the cutting dust or the abrasive agent or powder does not come in the ink fluid path portion. Since the photosensitive resin is present in the ink fluid path portion to be formed, there occurs no breakage of the substrate 1 or the like problem upon the cutting.

Figure 6:
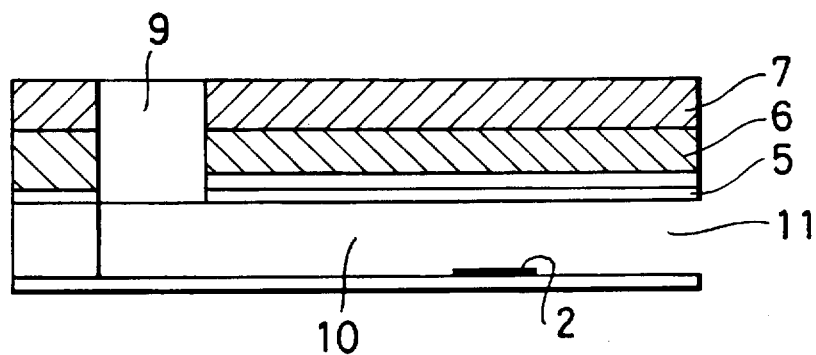
FIG. 6 is a schematic cross-sectional view showing an integrated substrate having an ink fluid path and an ink ejecting port formed by development.

Finally, as shown in FIG. 6, the resist forming the ink fluid path portion is eluted to form an ink fluid path 10, and the ink ejection port 11. Development may be performed with any solvent that can dissolve the resist. Thus, the ink ejection port 11 having a satisfactory shape is formed.

In the present invention, since the ink fluid path is formed after the cutting of the substrate, there occurs no problem of flowing down of an adhesive in the ink fluid path or peeling-off of the top plate due to lack of sufficient thickness of the adhesive layer, even when the adhesive layer is used in large amounts to bond the top plate at high temperatures and high pressures for fabricating long ink jet recording heads. Therefore, the present invention is advantageous in that not only the yield of ink jet recording head can be increased considerably but also reliability of the fabricated ink jet recording head can be increased.

As described above, according to the present invention, the problems involved in the conventional method of fabricating ink jet recording heads can be overcome by shifting the development step for developing the photosensitive resin to after the step of cutting the substrate to enable fabrication of ink jet recording heads having a uniform quality.

Basically, any resin may be used in the present invention as the photosensitive resin. However, in order to increase stability and reliance in the fabrication of ink jet recording heads, it is desirable to use resins which will be described in detail below.

Negative type resist materials are preferred as a photosensitive resin for forming the ink fluid path 10 since the negative type resist materials are excellent in various properties such as mechanical strength, heat resistance, solvent resistance, etc.

Ink jet recording heads require higher mechanical strength, higher resistance to inks, higher heat resistance when recording ink ejecting energy is given by thermally generated bubbles, than resist materials used in conventional semiconductor fabrication processes. Negative type resists are suitable as a photosensitive resin which satisfies such requirements.

As the negative-type photosensitive resin, there can be used any photosensitive resin. For example, there can be cited, a photosensitive resin containing a polymer, oligomer or monomer having an unsaturated double bond in its molecule, a photosensitive resin containing a monomer, oligomer or polymer having an epoxy ring, a photosensitive resin which crosslinks upon extraction of hydrogen atom and so on. The unsaturated double bond may be any one of those contained in acryloyl, methacryloyl, acrylamide, allyl, maleic acid diester, vinyl ether, vinyl thioether, vinylamino, acetylene and the like. The negative-type photosensitive resin may be a mixture of a monomer, oligomer, or polymer having such an unsaturated double bond or epoxy ring in the molecule, and a photopolymerization initiator.

The photosensitive resin may contain a binder, a filler, or a silane coupling agent for increasing adhesion with the substrate.

As the most general-purpose example, there can be cited, for example, a tri-component system consisting of a 9:1 copolymer of methyl methacrylate and methacrylic acid as a binder, pentaerythritol triacrylate as a polymerizable monomer, and tert-butoxyanthraquinone as a photopolymerization initiator.

As the monomer, in addition to the aforementioned ones, there can be cited, for example, acrylic or methacrylic monomers and oligomers, such as ethylene glycol diacrylate, diethylene glycol diacrylate, triethylene glycol diacrylate, polyethylene glycol dimethacrylate, polypropylene glycol diacrylate, polypropylene glycol dimethacrylate, butylene glycol dimethacrylate, butylene glycol diacrylate, neopentylene glycol diacrylate, neopentytene glycol dimethacrylate, 1,4-butanediol diacrylate, 1,6-hexanediol diacrylate, trimethylolpropane triacrylate, or trimethylolpropane trimethacrylate, etc.; allyl monomers and oligomers, such as diallyl orthophthalate, diallyl isophthalate, diallyl maleate, diallyl chlorendate, diallyl adipate, diallyl diglycolate, triallyl cyanurate, triallyl isocyanurate, trimethallyl isocyanurate, or diethylene glycol bis(allyl carbonate); acrylamide monomers and oligomers, such as N,N'-methylene-bis(acrylamide), or hexamethylenebisacrylamide; etc.

These monomers and oligomers may be blended with a binder such as monomers, e.g., methyl methacrylate, ethyl methacrylate, butyl methacrylate, or polymers, e.g., acrylic resins such as copolymers of these monomers, vinyl chloride, polyvinyl butyral, polyvinyl alcohol, nylon, etc.

As the photopolymerization initiator, there can be used, for example, benzil, 4,4'-dimethoxybenzil, 4,4'-dihydroxybenzil, thioxanthone, 2-chlorothioxanthone, isopropylthioxanthone, 2,4'-diethylthioxanthone, 2,4'-diisopropylxanthone, coumarin derivatives, s-triazine derivatives, camphorquinone, etc. Also, the photopolymerization initiator may contain amines such as diethylaminobenzoate, diethylaminobenzoate, diisobutylaminobenzoate, etc.

Since these radical polymerization negative resists are susceptible to inhibition of reaction by oxygen, a suitable exposure method is to coat a film of polyvinyl alcohol or the like on the film of the negative resist before exposure, or laminate the negative resist on a PET (polyethylene terephthalate) film or the like to form a dry film before exposure.

On the other hand, the monomers having an epoxy ring or vinyl ether bond in the molecule, which polymerize according to cation polymerization reaction, have among others an advantage in that they are not susceptible to inhibition of reaction by oxygen.

Examples of such a monomer having an epoxy ring or vinyl ether bond in the molecule include monomers and oligomers such as bisphenol A type epoxy resin, novolak type epoxy resin, hydrogenated bisphenol A type epoxy resin, vinyl ether compounds synthesized from polyalcohols, such as ethylene glycol divinyl ether, 2-chloroethyl vinyl ether, 2-hydroxyethyl vinyl ether, etc.

To the monomer are added the aforementioned binder and an aromatic onium salt which serves as a photocationic polymerization initiator to form a resist. As the onium salt, there can be cited, for example, diphenyliodonium tetrafluoroborate, diphenyliodonium hexafluorophosphate, diphenyliodonium hexafluoroarsenate, diphenyliodonium hexafluoroantimonate, etc.

The photocrosslinking negative-type resist may be formed as a mixture of a base resin selected from polymers which have an unsaturated double bond in the molecule or polymers having an extractable hydrogen atom such as styrene or polyhydroxystyrene, and a photocrosslinking agent such as a bisazide compound. In the case where it is exposed with ionizing radiation, the addition of the photocrosslinking agent is not mandatory.

As the base resin, there can be cited, for example, rubbers such as cyclized polyisoprenes, or polybutadienes, polydiallyl phthalates, unsaturated polyesters, polystyrenes, polyhydroxystyrenes, polyvinyl cinnamates, polyvinyl alcohols, polyvinyl butyral, etc. The photocrosslinking agent includes, for example, bisazide compounds such as 4,4'-diazidochalcone, 2,6-bis(4'-azidobenzal)-cyclohexanone, 2,6-bis (4'-azidobenzal)4-methylcyclohexanone, 1,3-bis(4'-azidobenzal)-2-propanone, etc.

With smaller molecular weight, the negative type resist gives rise to decreased scum, decreased amount of development residue due to fogging, resulting in that ink ejecting property can be increased. In the development of the resist after cutting, the smaller the molecular weight of the resist, the shorter the time required for the dissolution of the resist.

In other words, the smaller the molecular weight of the negative type resist, the more readily the resin in the unexposed portion upon development dissolves, thus decreasing the degree of swelling and shortening dissolution time. The lower the molecular weight, the less generation of gel component as a result of fogging of unexposed portion upon exposure, thus reducing the generation of development residue.

According to the present inventors' study, negative type resists which consist of molecules with weight average molecular weight of at most 30,000, more preferably at most 10,000, as polystyrene obtained by gel permeation chromatography have good properties with respect to the aforementioned reduction in scum, and development residue, and shortening of dissolution time. It is preferred that the weight average molecular weight of the negative type resist be at least 5,000.

The negative type photosensitive resins can be prepared by optimizing the molecular weight's of the aforementioned negative type photosensitive resins.

Examples of such a resin which exhibits sufficient resolution with a low molecular weight includes polydiaryl ortho- or isophthalate, unsaturated polyesters, novolak, polyhydroxystyrene, etc. The aforementioned photopolymerization initiator, or photocrosslinking agent such as azide, bisazide, etc. is added to prepare a photosensitive resin. When exposure is performed with ionizing radiation, the aforementioned resin may be used alone.

On the other hand, the present invention can be achieved using a positive type resist. However, application of generally used positive type resists is limited to pattern formation of those shapes that enables readily dissolution of resists since pattern formation with such generally used resists involves patterning by means of difference in the rate of dissolution in the developer between exposed portion and unexposed portion. That is, the generally used positive type resists are suitable for the fabrication of ink jet recording heads having an ink supply port and an ink fluid path each having a relatively large size. In particular, positive type resists are free of occurrence of scum due to swelling of the resist and generation of development residues due to fogging upon exposure, which enables fabrication of ink jet recording heads which have excellent ink ejection stability.

General-purpose positive type resists, which comprise a mixture of an alkali-soluble novolak resin and naphthoquinonediazide as a sensitizing agent, have poor mechanical strength and poor resistance to solvents, and hence it is desirable to cure the resin by heating after the development of the resist. Heating is performed preferably at 100° to 200° C. for 30 to 60 minutes. Sometimes it is effective to bake the resin by slowly elevating the temperature from 100° C. so that thermal deformation of patterns can be prevented.

Further, a method in which an amine is added to the resist, and a method in which novolak resin and naphthoquinonediazide are reacted with sulfonates before use are effective as means for decreasing dissolution of unexposed portion upon development, and for increasing mechanical strength and resistance to solvents.

The addition of an amine compound makes it possible to use an image reverse method in pattern formation. More specifically, when a positive type photoresist is baked, as it is after exposure, at 100° to 120° C. for about 30 minutes, an indenecarboxylic acid group generated upon irradiation of light and a novolak resin are reacted in the presence of an amine catalyst. Then, upon exposure overall the surface of the photoresist, the exposed portion at the first exposure is insoluble in the developer while unexposed portion is rendered soluble in the developer by the overall exposure. As a result, the initial exposure gives rise to a negative type pattern. According to this method, even when naphthoquinonediazide in the exposed portion upon the initial exposure is converted into indenecarboxylic acid, which is alkali-soluble, the resulting indenecarboxylic acid is reacted with the novolak resin by baking and is rendered insoluble in the developer. This makes a great difference in dissolution rate of the resist between the exposed portion and the unexposed portion. Hence, the aforementioned problems involved in the use of positive type resists in the present invention can be avoided. In other words, there can be minimized decrease in the film thickness of the photosensitive resin layer constituting the ink fluid path, and widening of pattern after prolonged development time. The reaction between the sensitizing agent and the novolak resin can increase the mechanical strength and resistance to solvents of the pattern.

Similar effects can also be obtained when a novolak resin and a naphthoquinonediazide compound are reacted through a sulfonic acid ester bond, etc.

Use of general-purpose positive type photoresist causes a further problem. Since generally used positive type photoresist comprises a mixture of a novolak resin and a naphthoquinonediazide compound which suppresses dissolution of the novolak resin, suppression of dissolution of the novolak resin is not complete. In addition, the use of naphthoquinonediazide compound leads to a decrease in the film strength of the resultant resist pattern since the naphthoquinonediazide compound has a low molecular weight. Although the decrease in the film thickness of the unexposed portion upon development can be minimized by the addition of a large amount of the naphthoquinonediazide compound in the resist, this decreases the film thickness further.

To overcome this problem, in this invention, a novolak resin and a naphthoquinonediazide compound are reacted through an ester bond such as a sulfonic acid ester bond. It is because a hydroxyl group is present in the molecule that a novolak resin is soluble in alkaline solutions. Hence, conversion of the hydroxyl group into a naphthoquinonediazide sulfonic acid ester results in a loss of the solubility of the novolak resin in alkaline conditions and the resin will no longer dissolve in alkali solutions. This prevents decrease in the film thickness of the unexposed portion upon development to a greater extent. On the other hand, in the unexposed portion, naphthoquinonediazide compound is converted into indenecarboxylic acid, which endows the resist with solubilities in alkali solutions.

As a result of the reaction of the naphthoquinonediazide compound, which is a low molecular weight compound, with the novolak resin through an ester bond, there is present no low molecular weight compound that decreases the film-forming property of the resist, and hence the resultant resist has high enough a film strength.

This resist can be prepared readily by dissolving a novolak resin in a solvent such as tetrahydofuran or the like, adding a quinonediazidesulfonyl chloride compound such as naphthoquinonediazidesulfonyl chloride, and further adding an aqueous solution of a weakly alkaline substance such as sodium carbonate. Sodium quinonediazidesulfonate may also be used instead of the quinonediazidesulfonyl chloride and the weakly alkaline substance.

As the novolak resin, there can be cited, for example, ortho-, meta- or para-cresol novolak, polyhydroxystyrene, phenol novolak, etc. As the sodium quinonediazidesulfonate, there can be used, sodium α,β-naphthoquinonediazidesulfonate, sodium benzoquinonediazidesulfonate, etc.

To further prevent decrease in the film thickness of the resist in the unexposed portion and increase the film thickness of the resist, a heat-crosslinking positive type resist is particularly useful.

Heat-crosslinking positive type resist is a resist comprising a photo- or ionizing radiation-degradable resin having copolymerized therewith a heat-crosslinkable functional group. The resist is coated on a substrate and then heated for curing. Thereafter, the cured resist is exposed to light (ionizing radiation) to degrade resin so as to be soluble in solvents, thus performing pattern formation. Because of its being positive type resist, the heat-crosslinking positive type resist exhibit high resolution in the formation of fine punched patterns such as ink fluid path formation. Also, this type of resist is advantageous in that since it is cured by heat-curing reaction, it can attain high mechanical strength, high solvent resistance, and sufficient bonding with the substrate. In particular, the unexposed portion of the resist is gelled due to heat-crosslinking reaction, and hence there occurs no dissolution at all after prolonged immersion in the developer.

On the other hand, in the exposed portion of the resist, the resist high polymer chain is degraded to pieces upon exposure to ionizing radiation or the like, and therefore the exposed portion can dissolve in the developer at high rates.

The film thickness of the unexposed portion of heat-crosslinking positive type resist does not change at all with varied amount of exposure. From this, it is sufficient to control only the thickness of coated film when it is intended to form nozzles of a designed size using heat-crosslinking positive type resist. This makes formation of nozzles simple and easy. Further, with the heat-crosslinking positive type resist, there arises no problem due to development residues, such as occurrence of development residue, or scum, or need of ashing operation.

Many kinds of heat-crosslinking positive type resist can be obtained by copolymerizing a photodegradable high molecular weight compound with a monomer having a heat-crosslinkable functional group. The photodegradable high molecular weight compound includes those high molecular compounds having a ketone structure in the molecule, those high molecular weight compounds containing an $SO_2$ group in the molecule, such as polysulfone, those high molecular weight compounds having a vinyl group and containing as attached to the α-position thereof an atom other than hydrogen or a group, such as methyl, chlorine, cyano, or fluorine.

As the high molecular weight compound having a ketone structure in the molecule, there can be cited, for example, high molecular weight compounds having a vinyl-containing ketone structure copolymerized thereto, such as methyl vinyl ketone, methyl isopropenyl ketone, ethyl vinyl ketone, tert-butyl propenyl ketone, and vinyl phenyl ketone.

The high molecular weight compound containing an $SO_2$ group includes polysulfone synthesized from bisphenol A and dichlorodiphenylsulfone (UDEL POLYSULFONE, registered trademark for a product by UCC), polyethersulfone synthesized from dichlorodiphenylsulfone (VICTREX, registered trademark for a product by ICI), polyolefinsulfone synthesized from an olefin having an unsaturated double bond and $SO_2$ (polybutene-1-sulfone PBS, produced by MEAD Co.), etc. Of course, the olefin moiety in the polyolefinsulfone may be any other olefin such as styrene, α-methylstyrene, or propylene.

The high molecular weight vinyl compound having attached to the α-position thereof an atom other than hydrogen or a group includes various methacrylates, for example, -methyl methacrylate, ethyl methacrylate, n- or iso-propyl methacrylate, n-, iso- or tert-butyl methacrylate. Also, methacrylamide, methacrylonitrile can be used. Photodegradable positive type resist can be prepared by copolymerizing these unsaturated double bond-containing monomers. In addition to the aforementioned methyl-containing vinyl monomers, those vinyl monomers having a cyano group, a halogen atom such as chlorine or fluorine, or the like at the α-position are generally available, which include methyl α-cyanoacrylate, methyl α-chloroacrylate, methyl α-fluoroacrylate, ethyl α-cyanoacrylate, ethyl α-chloroacrylate, ethyl α-fluoroacrylate, etc. Further, α-methylstyrene, α-chlorostyrene, α-cyanostyrene, and α-fluorostyrene, and hydroxy, methyl, ethyl, propyl, chloro, fluoro, etc. derivatives of α-methylstyrene, α-chlorostyrene, α-cyanostyrene, and α-fluorostyrene can also be used.

Photodegradable high molecular weight compound can be obtained by polymerizing the aforementioned monomers singly or as mixtures of two or more them. The crosslinking positive type resist used in the present invention can be synthesized by copolymerizing a monomer having a heat-curable functional group upon the synthesis of the photo-degradable high molecular weight compound.

The monomer having a-heat-curable functional group includes those monomers having a functional group such as a hydroxyl group, a chlorine atom, an isocyanate group, an epoxy group. Specific examples thereof include hydroxy-alkyl (meth)acrylate, hydroxyalkyl (e.g., hydroxymethyl, hydroxyethyl, hydroxypropyl) acrylate, hydroxyalkyl methacrylate, acryl chloride, methacryl chloride, glycidyl (meth)acrylate, etc. Copolymerization of the monomer having a heat-crosslinkable functional group with the aforementioned photodegradable high molecular weight compound gives rise to a heat-crosslinking positive type resist used in the present invention. Of course, in order to increase curing properties of the resins, it is effective to mix or copolymerize a component having an isocyanate group or an amino group with the resins to accelerate heat-curing of hydroxyl groups and epoxy groups.

Further investigation on the heat-curing positive type resist as a material for forming nozzles in an ink jet recording head revealed that more preferred monomer to be copolymerized as a heat-crosslinking group includes methacrylic acid and glycidyl methacrylate. Use of monomers containing halogen such as chlorine results in elution of halogen in the ink after or during prolonged use of the recording head, which causes corrosion or disconnection of the electrodes and the heater. The isocyanate-containing system has a problem that storage stability of the resist is very low. In contrast, systems containing methacrylic acid or glycidyl methacrylate are free of such problems and exhibit excellent properties as a material for forming nozzles in an ink jet recording head.

The heat-curing positive type resist can be coated on a substrate by coating as it is or solvent-coating a solution of the resist in a solvent when it is solid using a spin coater, bar coater or the like.

Temperature, time, etc. of heat-curing must be optimized depending on the resin. Generally, suitable heat-curing temperature is within the range of from 50° to 300° C. If the temperature is too low or below 50° C., sufficient crosslinking density cannot be obtained or the crosslinking takes a long time. On the other hand, if the temperature exceeds 300° C., there occurs thermal decomposition or thermal oxidation of the resist, or in some cases cracks tend to occur in the resist film due to difference in thermal expansion coefficient between the substrate and the resist film when the temperature is lowered down to room temperature after the heating operation. While heating time must be optimized taking into consideration the properties of the resist, generally it is within the range of from about 5 to about 120 minutes. Heating at low temperatures may be performed in the air while in order to prevent thermal oxidation or the like, heating may be performed in an inert gas atmosphere such as nitrogen or in vacuum.

Of course, crosslinking group-containing solution may be of two-pack type so that it can be cured at room temperature. For example, when component A containing an epoxy group as a crosslinking component in the molecule and component B containing an amino group are mixed, and then the mixture is coated on a substrate, the mixture can be cured at room temperature. To note, use of two-pack type resist is to increase storage stability at room temperature. However, from viewpoint of increasing productivity such as shortening of curing time, heat treatment is desirable. These measures may also be applied to hydroxyl group-containing system and isocyanate group-containing system.

The heat-curing positive type resist is one sensitive to deep UV rays having wavelengths below 300 nm, electron beam, and ionizing radiation such as X rays, and hence it is useless to expose the resist using a conventional UV exposing device.

Exposure may be performed with deep-UV rays from a cold mirror at 290 nm or 250 nm using a Xe-Hg lamp which is a deep-UV source employed generally, or with any of electron beam, X rays, excimer laser beam, etc., in any manner, e.g., flush exposure, step & repeat, beam scanning of electron beam, etc. However, lights with short wavelengths such as deep-UV ray or excimer laser beam sometimes fail to transmit through the resist film, thus failing to achieve uniform exposure, due to absorption by the resist film when it is thick. For example, when an aromatic ring is present in the molecular structure of the resist, the resist film has a particularly high optical absorption and transmits no or reduced amount of light. Thus, it becomes sometimes necessary to use resist which contains no aromatic ring, or highly transmissive light sources such as electron beam or X rays as a remedy for such defects. Among exposure devices now available, deep-UV exposure is considered to be most productive since it is flush exposure and covers a wide exposure area while X ray exposure is most suitable for the present invention because of its high transmission, which allows selection of materials from a wide range. It will be applied practically if further development is made on the increase in the intensity of light source and reduction in the cost of mask and exposure device.

EXAMPLES

Hereinafter, the present invention will be described in more detail by non-limitative examples.

Example 1

On a glass substrate 1 having formed thereon an electrothermal transducer (heater consisting of $HfB_2$) as an energy generation device 2 was coated a cyclized rubber-bisazide photoresist (OMR-83, trade name for a product by Tokyo Ouka Kogyo Co., Ltd.) using a #70 wire bar. After the solvent was removed by heating at 80° C. for 30 minutes, the substrate was exposed using a mask aligner (PLA-520FA, produced by Canon Inc.) to form image of an ink fluid path pattern in the resist. The thickness of the resist was 35 µm.

Then, an acrylic negative type dry film (ODEAL, trademark for a product by Tokyo Ouka Kogyo Co., Ltd.) was laminated at 100° C. on a glass substrate or top plate 7 provided with an ink supply port 9, and the dry film was exposed for 200 seconds using a mask aligner (PLA-520FA, produced by Canon Inc.). This exposure was to form a pattern for an upper part of an ink fluid path 10 so that the height of the ink fluid path 10 between the ink supply port 9 and the energy generation device 2 could be made larger to decrease the path resistance. After removal of the base film, the substrate was dipped in trichloromethane for 150 seconds for development. The pattern formed had a film thickness of 50 µm.

On the pattern thus formed was coated an epoxy adhesive (ARALDITE, trademark for a product by THREE BOND CO.) with a roll coater. The thickness of the coated film was 10 μm. Then, the top plate 7 was bonded to the substrate 1 in vacuum, and the product was heated at 80° C. for 30 minutes to cure the adhesive.

Next, the substrate 1 was cut using a dicing saw (TOKYO SEIMITSU CO., LTD.) and the negative type resist was eluted. The elution was performed by dipping the substrate in toluene for 30 minutes. After the development, the substrate was further dipped in isopropyl alcohol for 5 minutes for rinsing.

Finally, an ink supply element was bonded to the ink supply port 9 to fabricate an ink jet recording head.

The ink jet recording head thus fabricated was mounted to a recording apparatus.

Figure 7:
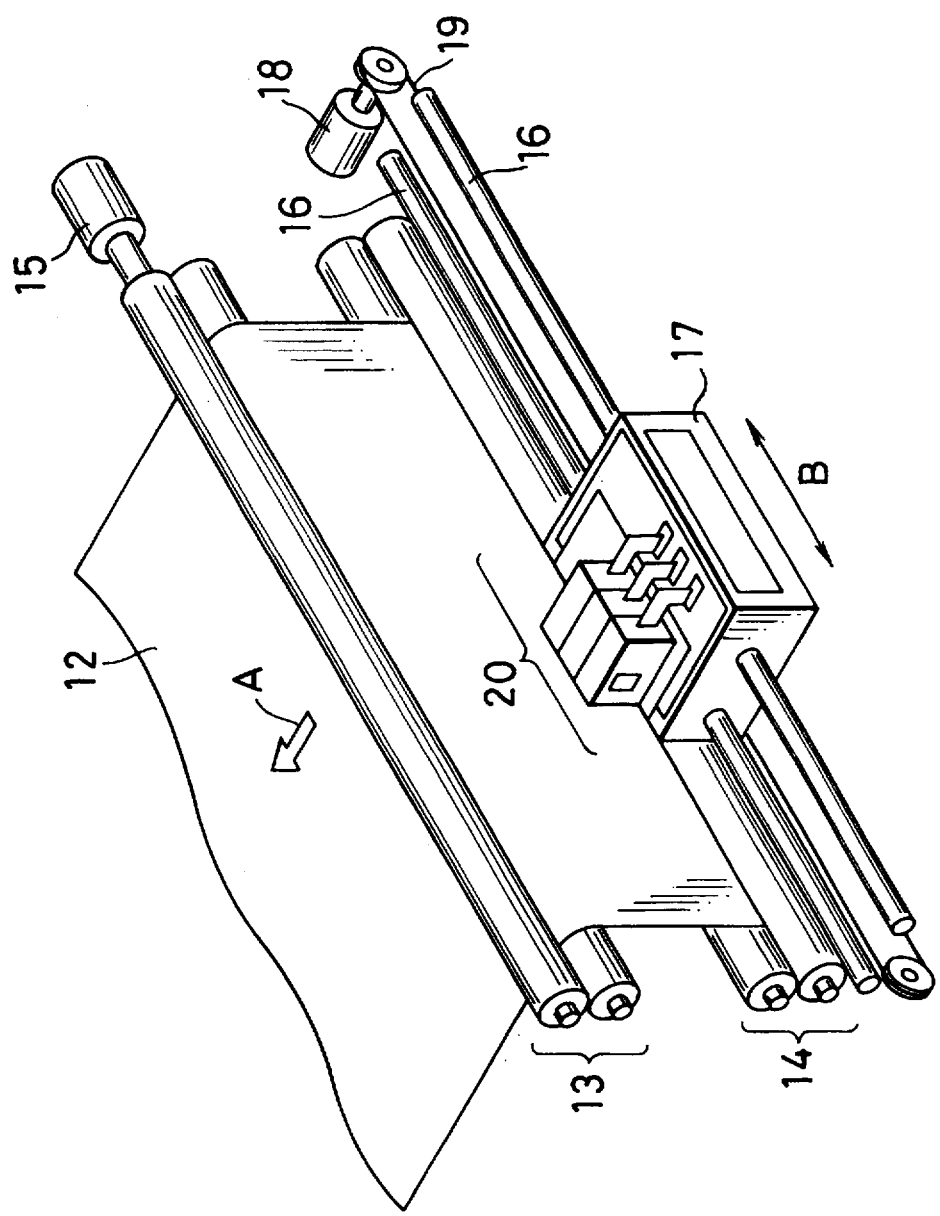
FIG. 7 is a schematic perspective view showing an ink jet recording apparatus.

FIG. 7 is a schematic perspective view showing an arrangement of a recording apparatus.

In FIG. 7, a recording medium 12, such as paper or plastic sheet, was supported by a pair of convey roll 13, 14, including a pair of rolls arranged one above and the other below a recording region, and conveyed in a direction indicated by the arrow A by the convey roll 13 driven by a sheet feed motor 15. In the front of the convey rolls 13 and 14, a guide shaft 16 is provided parallel to the convey rolls 13 and 14. Along the guide shaft 16 a carriage 17 moves reciprocatingly in a direction indicated by the arrow B by an output of the carriage motor 18 through a wire 19.

In the carriage 17 was mounted a recording head unit 20 which is the aforementioned ink jet recording head. On the front surface of the recording head unit 20, i.e., the one that faces a surface of the recording medium 12 at a predetermined distance, is provided a recording portion having a plurality of ink ejecting ports in an arrow.

Recording was performed in the recording apparatus shown in FIG. 7 with deionized water/glycerol/Direct Black 154 (water-soluble black dye)=65/30/5 as the recording liquid or ink. As a result, stable setting was obtained.

Example 2

This example is to practice pattern formation using a radical polymerization monomer.

In cyclohexanone were dissolved 75 parts of an acrylic monomer (ARONICS, trademark for a product by Toa Gosei Co., Ltd.), 20 parts of a 9:1 copolymer of methyl methacrylate/methacrylic acid (produced by Polyscience CO., Ltd.; molecular weight: 500,000), 3 parts of 2-chlorothioxanthone, 2 parts of ethyl p-dimethylaminobenzoate, and the resulting solution was coated on a substrate 1 in the same manner as in Example 1. The coated substrate was dried at 80° C. for 30 minutes to remove the solvent, and then a 10% aqueous solution of polyvinyl alcohol (produced by Kishida Kagaku Co., Ltd.; molecular weight: 500) was coated on the resist using a spinner. This coating film was formed in order to prevent the inhibition of radical reaction by oxygen. The resist film was 50 μm thick, and the polyvinyl alcohol film was 2 μm thick.

In the same manner as in Example 1, pattern (imagewise) exposure was performed in the region 10 which should become an ink fluid path, and then the substrate was dipped in water to remove the polyvinyl alcohol film.

Also, in the same manner as in Example 1, the top plate 7, i.e., top plate having coated on one surface thereof an epoxy adhesive, was bonded to the substrate in vacuum, and then the integrated substrate was heated at 80° C. for 30 minutes to cure the adhesive.

Further, in the same manner as in Example 1, the integrated substrate was cut with a dicing saw, dipped in methyl isobutyl ketone for 30 minutes to remove the resist in the unexposed portion, and then dipped in isopropyl alcohol for 10 minutes for rinsing.

Recording was performed in the same manner as in Example 1 with supplying ink. As a result, good setting was obtained.

Example 3

In Examples 1 and 2, a large amount of scum was observed when the substrate was viewed from above the top plate. This example was to prevent the occurrence of scum using an acrylic resin having a decreased molecular weight as a binder.

The same procedure as in Example 2 was repeated except that a solution of 75 parts of an acrylic monomer (ARONICS 6880), 20 parts of polymethyl methacrylate (ELVACITE 2001, trademark for a product by Du Pont), 3 parts of 2-chlorothioxanthone, and 2 parts of ethyl p-dimethylamiobenzoate in cyclohexanone was used as the resist solution.

In this example, good setting was obtained, and the occurrence of scum was reduced considerably.

Example 4

This example used an alkali-soluble resin and practiced by an alkali development method.

To polyhydroxystyrene (Maruzen Petrochemical Co., Ltd.; molecular weight: 5,000) was added 3 parts of 4,4'-diazidechalcone (Shinko Giken Co., Ltd.), and the mixture was dissolved in cyclohexanone. The solution was coated on the substrate 1, and baked at 80° C. for 30 minutes. The resultant film was 35 μm thick.

In the same manner as in Example 1, pattern (imagewise) exposure was performed on the resist film in a region where an ink fluid path should be formed, and then the top plate 7 was bonded to the substrate. The integrated substrate was heated at 80° C. for 30 minutes to cure the epoxy adhesive, followed by cutting the substrate using a dicing saw.

Then, the substrate was dipped for 30 minutes in an alkali developer (MIF-312, Hoechst) diluted 2-fold with water to wash the resist off, followed by rinsing with water.

Printing was performed in the same manner as in Example 1. As a result, good setting was obtained.

Example 5

This example used deep-UV-sensitive negative type resist and photocurable adhesive to increase operability.

A mixed resist consisting of polyhydroxystyrene and 3,3'-diazidodiphenylsulfone (RD-2000N, Hitachi Kasei Co., Ltd.) was concentrated 2-fold by removing the solvent therefrom using a rotary evaporator. The resist thus obtained was coated on the substrate 1 using a spinner and prebaked at 80° C. for 30 minutes. The resist film was 30 μm thick.

The substrate was exposed for 60 seconds using an exposure device of which the mask aligner (PLA-520FA, produced by Canon Inc.) was changed to a deep-UV source to effect pattern exposure for an ink fluid path to be formed in the resist.

After the top plate 7 was provided with a resist pattern in the same manner as in Example 1, a photosensitive adhesive (THREE BOND 3000, Three Bond Co.) was coated to a thickness of 5 μm on the pattern using a roll coater.

The top plate 7 was mounted on the mask plate of the mask aligner (PLA-520FA, produced by Canon Inc.), and the substrate 1 was mounted on the wafer chuck. After aligning, the substrate was exposed for 200 seconds as it is to cure the photosensitive adhesive. In this case, a sharp cut filter produced by Fuji Photo Film Co., Ltd. was placed on the top plate 7 in order to cut UV rays having wavelengths below 300 nm and prevent RD-2000N from being exposed to lights having shorter wavelengths from the UV lamp.

After cutting the substrate in the same manner as in Example 1, the resist was eluted and washed in the same manner as in Example 4, and ink ejection was performed.

In this example, good setting was obtained.

Example 6

This example used a positive type photoresist.

A positive type photoresist (AZ-4903, Hoechst) was coated on the substrate 1 fabricated in the same manner as in Example 1 using a spinner, and baked at 90° C. for 30 minutes. The resultant resist film was 25 μm thick.

In the same manner as in Example 1, pattern exposure was performed on for curing, followed by cutting the substrate 1.

The substrate 1 was dipped for 60 minutes in a developer prepared by diluting an alkali developer MIF-312 with water 2-fold to remove the resist in the exposed portion.

Since the resist film as it was poor in its strength and resistance to solvents, the resin was cured by heating. The heating was performed in 3 stages, i.e., by baking at 120° C. for 30 minutes, at 150° C. for 30 minutes, and then at 200° C. for 30 minutes. After these operations, the resist was cured and had increased strength and increased resistance to solvents.

In the same manner as in Example 1, ink was supplied and printing was performed. As a result, good setting was obtained.

Example 7

In Example 6, the unexposed portion was dissolved slightly upon the development of the resist, resulting in that the configuration of the ink fluid path deviated from the designed size to some extent. This example was to prevent dissolution of the unexposed portion of the resist upon development by an image reverse method and increase the strength and resistance to solvents of the resist film.

In the same manner as in Example 6, a positive type photoresist AZ-4903 was coated on a substrate, and prebaked at 90° C. for 10 minutes. The resulting film was 25 μm thick.

Exposure (exposure amount: 1,000 mJ/cm$^2$) was performed on the substrate in a region where an ink fluid path should be formed using a mask aligner (PLA-520FA, produced by Canon Inc.), and thereafter baked as it was at 100° C. for 30 minutes. Further, the substrate was dipped for 5 minutes in a developer prepared by diluting an alkali developer MIF-312 with water 4-fold, followed by overall exposure using PLA-520FA at an exposure amount of 2,500 mJ/cm$^2$ to reverse the image.

In the same manner as in Example 5, the top plate 7 coated with a photosensitive adhesive was bonded to the substrate 1, aligned, and subjected to overall exposure to cure the adhesive.

After cutting it with a dicing saw, the integrated substrate was dipped in a stock solution of an alkali developer MIF-312 for 30 minutes to form an ink fluid path. Thereafter, the substrate was baked at 150° c. for 30 minutes to cure the resist film.

With supplying ink, printing was performed. As a result, good setting was obtained.

Example 8

This example used reaction between a novolak resin and a quinonediazide compound to minimize decrease in the film thickness of the resist upon development.

Synthesis of resist: To a solution of 50 parts of polyhydroxystyrene (Maruzen Petrochemical Co., Ltd.; molecular weight: 5,000) in 100 parts of tetrahydrofuran was added 100 parts of sodium naphthoquinone (1,2)diazide-5-sulfonate. While stirring at 40° C., 50 parts of a 5 wt % calcium carbonate solution was added dropwise over 1 hour to the resulting mixture, and the stirring was continued for further 2 hours. The reaction mixture was poured in 1,000 parts of water to recover a resin, which was dissolved again in tetrahydrofuran, precipitated with cyclohexanone, and dried. The resin thus obtained was dissolved in cyclohexanone to a concentration of 25 wt % to form a resist solution.

In the same manner as in Example 7, the resist solution was coated on a substrate, and baked at 90° C. for 10 minutes. After pattern exposure was performed on the resist film in a region where an ink fluid path should be formed, the top plate 7 coated with an epoxy adhesive was bonded to the substrate in the same manner as in Example 1. The integrated substrate was heated at 80° C. for 30 minutes to cure the epoxy adhesive.

After cutting it using a dicing saw, the substrate was dipped for 30 minutes in an alkali developer (MIF-312, Hoechst) diluted 2-fold with water to develop the resist.

Since the film thus obtained did not cure as it was, overall exposure was performed using PLA-520FA at an exposure amount of 2,000 mJ/cm$^2$. Thereafter, the substrate was left to stand in vacuum for 1 hour to remove nitrogen gas. Thereafter, the substrate was heated at 150° C. for 1 hour to cure the resist.

In the same manner as in Example 1, ink was supplied and printing was performed. As a result, good setting was obtained.

Example 9

This example was used a heat-crosslinking positive type resist.

On the substrate 1 fabricated in the same manner as in Example 1 was coated a solution 8:2 copolymer of methyl methacrylate and methacrylic acid (Polyscience Co., Ltd.) in diacetone alcohol using a #70 wire bar. After heating it at 80° C. for 30 minutes to remove the solvent, the substrate was further heated at 200° C. for 30 minutes to cure the resist film. The resist film was 20 μm thick.

The substrate was exposed using a 2 kW deep-UV source (with a 250 nm cold mirror) produced by Ushio Electric Co., Ltd., for 10 minutes, and then a glass top plate coated with a photosensitive adhesive was bonded to the substrate in vacuum.

UV rays were irradiated from above the glass top plate 7 to bond the substrate 1 with the top plate 7 (i.e., cure the photosensitive adhesive), and the integrated substrate was cut using a dicing saw.

The substrate 1 was dipped in methyl isobutyl ketone for 20 minutes to develop the resist.

Printing was performed in the same manner as in Example 1. As a result, good setting was obtained.

Example 10

An ink jet recording head having the construction as shown in FIG. 6 was fabricated similarly to the procedure shown in FIGS. 1 to 6.

On a glass substrate 1 having formed thereon an electrothermal transducer (heater consisting of HfB$_2$) as an energy generation device 2 was coated a 20% solution of a 80:20 (mol) copolymer of methyl methacrylate and methacrylic acid (Polyscience Co., Ltd.) in cyclohexanone using a #70 wire bar. After the solvent was removed by heating at 80° C. for 30 minutes, the resin was heated at 200° C. for 1 hour to heat-cure it. The resultant film was 20 μm thick. The film did not dissolve in solvents.

The substrate 1 was irradiated with deep-UV rays using an exposure device having a Xe-Hg lamp (2 kW) produced by Ushio Electric Co., Ltd. through a mask containing a pattern for an ink fluid path. The exposure was conducted using a 250 nm cold mirror and exposure time was 10 minutes.

Then, an acrylic negative type dry film (ODEAL, trademark for a product by Tokyo Ouka Kogyo Co., Ltd.) was laminated at 100° C. on a glass substrate or top plate 7 provided with an ink supply port 9, and the dry film was exposed for 200 seconds using a mask aligner (PLA-520FA, produced by Canon Inc.). This exposure was to form a pattern for an upper part of an ink fluid path 10 so that the height of the ink fluid path 10 between the ink supply port 9 and the energy generation device 2 could be made larger to decrease the resistance of the ink fluid path. After removal of the base film, the substrate was dipped in trichloroethane for 150 seconds for development. The pattern formed was 50 μm thick.

On the pattern thus formed was coated a photosensitive adhesive (THREE BOND 3000, Three Bond Co.) with a roll coater. The thickness of the coated film was 10 μm. Then, the top plate 7 was bonded to the substrate 1 in vacuum.

The substrate 1 was subjected to overall exposure using a mask aligner (PLA-520FA, produced by Canon Inc.). The exposure time was 600 seconds. Thereafter, the substrate was baked at 200° C. for 30 minutes to solidly bond the adhesive.

Next, the substrate 1 was cut using a dicing saw (Tokyo Seimitsu Co., Ltd.), and the heat-crosslinking positive type resist was dipped in methyl isobutyl ketone for 30 minutes to elute it.

Finally, an ink supply element was bonded to the ink supply port 9 to fabricate an ink jet recording head.

The ink jet recording head thus fabricated was mounted on a recording apparatus, recording was performed in the recording apparatus with deionized water/glycerol/Direct Black 154 (water-soluble black dye)=65/30/5 as the recording liquid or ink. As a result, stable setting was obtained.

Example 11

A reaction vessel was charged with 100 parts of benzene, 95 parts of methyl methacrylate and 7.1 parts of glycidyl methacrylate (monomer ratio=95:5), and 1 part of N,N'-azobisisobutyronitrile as a copolymerization initiator, and the mixture was stirred at 60° C. for 2 hours in nitrogen atmosphere to synthesize a resin. The reaction mixture was poured in cyclohexane to recover the resin. The resin had a weight average molecular weight of 100,000. Next, the resin was dissolved in toluene in a concentration of 25 wt %, and triethylenetetramine was added as a crosslinking agent in an amount of 3 parts per 100 parts of the solid content.

The resist was coated in the same manner as in Example 1 on the substrate 1 provided with the energy generation device 2 to a thickness of 20 μm, and heated at 200° C. for 30 minutes to heat-cure it.

In the same manner as in Example 10, deep-UV rays were irradiated to the resist film to perform pattern exposure for an ink fluid path 10. The exposure time was 15 minutes.

The glass top plate 7 fabricated in the same manner as in Example 10 was bonded on the resist film 3 after the pattern exposure and the integrated substrate was irradiated with light to cure the adhesive.

After cutting it in the same manner as in Example 10, the integrated substrate was dipped in methyl isobutyl ketone for 30 minutes to develop the heat-crosslinking positive type resist.

In the same manner as in Example 10, an ink supply element was mounted, ink was supplied and printing was performed. As a result, good setting was obtained.

Example 12

On the substrate 1 having formed thereon the energy generation device 2 was coated a solution of a copolymer of methyl methacrylate and methacrylic acid in cyclohexanone using a #70 wire bar.

After removal of the solvent by baking at 80° C. for 30 minutes, the substrate was baked in nitrogen stream at 200° C. for 30 minutes to cure the resin. The film thus obtained was 25 μm.

The substrate 1 was mounted on an electron beam line scanner (ELS-3300, Elionics Co., Ltd.), and a pattern of an ink fluid path was depicted. The exposure amount was 70 μC/cm$^2$.

In the same manner as in Example 1, a dry film pattern was formed on the resist film, and the glass top plate 7 coated with a photosensitive adhesive was bonded thereto. After baking at 200° C. for 30 minutes, the integrated substrate 1 was cut, and dipped in methyl isobutyl ketone for 30 minutes to perform development.

In the same manner as in Example 10, an ink supply element was mounted and ejection of ink was performed. As a result, good setting was obtained.

The present invention has a great effect on the recording head and recording apparatus using the method wherein heat generating means (e.g., an electro-thermal transducer or laser light beams) are provided to generate energy used for discharging ink and the energy changes the state of ink, among many ink-jet recording methods. The above method can achieve high density and high accuracy of recording images.

With respect to the typical construction and the principle, it is preferable to use the basic principle disclosed in U.S. Pat. Nos. 4,723,129 and 4,740,796. Although this method is applicable to both a so-called on-demand type ink jet recording method and continuous type ink jet recording method, it is particularly suitable for the on-demand type apparatus. The reason is as follows. In the on-demand type apparatus, thermal energy is generated in the electro-thermal transducer disposed corresponding to a sheet and a liquid path including a liquid (ink) by applying at least one driving signal to give a rapid temperature rise above the nuclear boiling to the electro-thermal transducer, which generates film boiling on the heat generating surface of the recording head. As a result, this is effective because bubbles can be formed in the liquid (ink) with the one-to-one correspondence to the driving signal. By using the growth and the contraction of bubbles, a liquid (ink) is discharged via a discharge aperture (discharge orifice) and at least one liquid droplet is formed. When the driving signal becomes in the shape of pulses, the bubbles grow and contract promptly and appropriately. Consequently, the liquid (ink) discharge with the good responsibility can be preferably achieved. The suitable pulse-shaped driving signal is disclosed in U.S. Pat. Nos. 4,463,359 and 4,345,262. When conditions on the temperature rise on the heat generating surface disclosed in U.S. Pat. No. 4,313,124 are employed, better recording can be performed.

The present invention is effective to the construction of the recording head disclosed in U.S. Pat. Nos. 4,558,333 and 4,459,600 in which the heat generating portion is arranged in a bent portion in addition to the above combination of the discharge orifices, liquid paths and electro-thermal transducers (linear liquid path or right angle liquid path) disclosed in the above specifications. Moreover, the present invention is effective to the construction disclosed in Japanese Patent Application Laying-Open No. 123670/1984 wherein a discharge portion having a common slit as a discharge aperture portion is provided for a plurality of electro-thermal transducers and the construction disclosed in Japanese Patent Application Laying-Open No. 138461/1984 wherein an aperture for absorbing a pressure wave of thermal energy is provided corresponding to a discharge portion. That is, according to the present invention, recording can be performed certainly and effectively in spite of the form of the recording head.

Moreover, the present invention is applicable effectively to a full-line type recording head having a length corresponding to the max. width of a recording medium to be recorded by the recording apparatus. As the recording head, a combination of a plurality of recording heads which has the above length or an integrally formed single recording head can be used in the construction of the recording apparatus.

In addition, the present invention is effective to various serial type recording heads: a recording head fixed to a recording apparatus body, an exchangeable chip-type recording head in which electrical connection to a recording apparatus body can be made and ink can be supplied to the recording head from the recording apparatus body by mounting the recording head on the recording apparatus body, and a cartridge type recording head with an ink tank integrally provided on the recording head.

Additionally, when discharge recovery means of a recording head and preliminary auxiliary means are added to the configuration of the recording apparatus according to the present invention, the effect of the present invention can be further stabilized. Specifically speaking, there are capping means for the recording head, cleaning means for cleaning up the recording head, pressure or suction means for the recording head, preliminary heating means for preliminary heating by an electro-thermal transducer to generate heat energy for discharging ink droplets, other heating elements or a combination of other heating elements and the electro-thermal transducer, and preliminary discharge means for performing discharge other than discharge for recording.

Moreover, the number and type of recording heads to be mounted on a recording apparatus can be also changed. For example, only one recording head corresponding to single color ink or a plurality of recording heads corresponding to a plurality of kinds of ink different in color or concentration can be used. In other words, as the recording mode of the recording apparatus, not only monochromatic recording mode of a only major color like black but also an integrally fabricated recording head or a plurality of combined recording heads, are usable. The present invention can be also really effective to an recording apparatus having at least one of the multi-color mode of different colors and the full-color mode of mixed colors.

In addition, in the above stated embodiments of the present invention, ink is described as a liquid. However, ink which solidifies at room temperatures or below but softens or liquefies at room temperatures, can be used in the present invention because the ink can be liquefied to use at recording. Moreover, in the ink-jet recording method, in some cases, temperatures are controlled so that the temperature of ink ranges from 30° C. to 70° C., and that the viscosity of the ink is suited to stable discharging. In the above case, ink which liquefies at temperatures between 30° C. to 70° C. can be used. Additionally, since a temperature rise of ink itself or evaporation of the ink by thermal energy is prevented positively by using the thermal energy for changing the state of the ink from a solid to a liquid, ink which does not liquefy until it is heated, can be also used. In any case, ink which liquefies by supplying heat energy according to a recording signal and then is discharged or ink which liquefies by heating such as ink which solidifies when ink reaches to a recording medium, can be used in the present invention. In these cases, in the state of a liquid or a solid held in a porous sheet recess or a penetrating hole disclosed in Japanese Patent Application Laying-Open Nos. 56847/1979 and 71260/1985, ink can be opposed to the electro-thermal transducer. In the present invention, the most effective method to the above each ink is the film boiling method.

In addition, the ink-jet recording apparatus of the present invention can be used not only as an image output terminal of an information processing device such as a computer but as a copying apparatus in combination with a reader or a facsimile having the transmitting and receiving functions.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A method of fabricating an ink jet recording head, comprising the steps of:

forming a photosensitive resin layer on a substrate having formed thereon an energy generation device for generating energy for ejecting recording droplets;

pattern-wise exposing, to an active radiation, a portion of said photosensitive resin layer where formation of a pattern of an ink fluid path is desired;

laminating a top plate on said photosensitive resin layer; and eluting, after said laminating step, said pattern-wise exposed portion of said photosensitive resin layer to form said pattern of said ink fluid path.

2. The method as claimed in claim 1, wherein said photosensitive resin layer is formed with a heat-crosslinking positive type resist.

3. The method as claimed in claim 2, wherein said heat-crosslinking positive type resist comprises one of a photo- and a radiation-degradable resin having a heat-crosslinkable functional group.

4. The method as claimed in claim 3, wherein said heat-crosslinking positive type resist comprises a copolymer of a photodegradable high molecular weight compound with a monomer having a heat-crosslinkable functional group.

5. The method as claimed in claim 4, wherein said photodegradable high molecular weight compound is selected from the group consisting of a high molecular compound having a ketone structure, a high molecular weight compound containing an $So_2$ group, and a high molecular weight compound having a vinyl group and comprising one of an atom or a group other than hydrogen attached to the α-position thereof.

6. The method as claimed in claim 4, wherein said monomer having a heat-crosslinkable functional group comprises a monomer having a member selected from the group consisting of a hydroxyl group, a chlorine atom, an isocyanate group, and an epoxy group.

7. The method as claimed in claim 6, wherein said monomer having a heat-crosslinkable functional group is selected from the group consisting of methacrylic acid and glycidyl methacrylate.

8. The method as claimed in claim 2, wherein said photosensitive resin layer is heat-crosslinked at 50° to 300° C. for 5 to 120 minutes.

9. The method as claimed in claim 1, wherein said photosensitive resin layer is formed with a positive type photoresist.

10. The method as claimed in claim 9, wherein said positive type photoresist comprises a reaction product of a novolak resin and a quinonediazide bonded through a sulfonic acid ester bond.

11. The method as claimed in claim 10, further comprising the step of heating said photoresist after said eluting.

12. The method as claimed in claim 11, wherein said photoresist is heated at 100° to 200° C. for 30 to 60 minutes.

13. The method as claimed in claim 9, wherein said positive photoresist contains an amine.

14. The method as claimed in claim 9, further comprising the steps of:

baking said photoresist at 100° to 120° C. after said pattern-wise exposure; and overall exposing a surface of said pattern-wise exposed photoresist to light, rendering said exposed portion of said photosensitive resin layer insoluble.

15. The method as claimed in claim 1, further comprising the step of forming an adhesive layer on said top plate through a top plate resin layer.

16. The method as claimed in claim 1, further comprising the step of cutting the resulting laminate with a cutting means before said eluting so that said energy generation device is located at a predetermined distance from an ink ejection port.

17. A method of fabricating an ink jet recording head, comprising the steps of:

forming a photosensitive resin layer on a substrate having formed thereon an energy generation device for generating energy for ejecting recording droplets;

pattern-wise exposing, to an active radiation, a portion of said photosensitive resin layer where formation of a pattern of an ink fluid path is desired;

laminating a top plate on said photosensitive resin layer; and eluting, after said laminating step, an unexposed portion of said photosensitive resin layer to form said pattern of said ink fluid path.

18. The method as claimed in claim 17, wherein said photosensitive resin layer comprises a negative type resist.

19. The method as claimed in claim 18, wherein said photosensitive resin comprises a tri-component system consisting of a binder, a polymerizable monomer, and a photopolymerization initiator.

20. The method as claimed in claim 19, wherein said photosensitive resin comprises a 9:1 copolymer of methyl methacrylate and methacrylic acid, pentaerythritol triacrylate, and tert-butoxyanthraquinone.

21. The method as claimed in claim 19, wherein said polymerizable monomer is selected from the group consisting of a monomer having an epoxy ring and a monomer having a vinyl ether bond.

22. The method as claimed in claim 18, wherein a resin constituting said negative type resist has a weight average molecular weight within the range of 5,000 to 30,000.

23. The method as claimed in claim 18, wherein said negative-type photosensitive resin is selected from the group consisting of a photosensitive resin containing a polymer, oligomer, or monomer that has an unsaturated double bond, a photosensitive resin containing a polymer, oligomer, or monomer that has an epoxy ring, and a photosensitive resin which crosslinks upon extraction of hydrogen atom.

24. The method as claimed in claimed 18, wherein said negative-type photosensitive resin comprises at least one selected from the group consisting of a binder, a filler and a silane coupling agent.

25. The method as claimed in claim 18, wherein said photosensitive resin layer is exposed through a film selected from the group of a polyvinyl alcohol film and a polyethylene terephthalate film.

26. The method as claimed in claim 17, further comprising the step of forming an adhesive layer on said top plate through a top plate resin layer.

27. The method as claimed in claim 17, further comprising the step of cutting the resulting laminate with a cutting means before said eluting so that said energy generation device is located at a predetermined distance from an ink ejection port.

* * * * *

UNITED STATES PATENT AND TRADEMARK OFFICE
CERTIFICATE OF CORRECTION

PATENT NO. : 5,730,889

DATED : March 24, 1998

INVENTOR(S) : MASASHI MIYAGAWA ET AL.

It is certified that error appears in the above-identified patent and that said Letters Patent is hereby corrected as shown below:

Title page,
AT [57] ABSTRACT

Line 11, "a substrate" (first occurrence) should be deleted--.

COLUMN 1

Line 34, "is" should read --in--.

COLUMN 2

Line 3, "which follows." should read --as follows:--; and
    Line 17, "problem," should read --problems,--.

COLUMN 3

Line 36, "an" should read --can--.

COLUMN 7

Line 8, "lamide; etc." should read --lamide, etc.--.

COLUMN 8

Line 21, "weight's" should read --weights--.

COLUMN 15

Line 59, "150° c." should read --150° C--.

COLUMN 19

Line 46, "a" should read --an--.

UNITED STATES PATENT AND TRADEMARK OFFICE
CERTIFICATE OF CORRECTION

PATENT NO. : 5,730,889

DATED : March 24, 1998

INVENTOR(S) : MASASHI MIYAGAWA ET AL.

It is certified that error appears in the above-identified patent and that said Letters Patent is hereby corrected as shown below:

<u>COLUMN 20</u>

Line 50, "So$_2$" should read --SO$_2$--.

Signed and Sealed this

Fifteenth Day of December, 1998

*Attest:*

BRUCE LEHMAN

*Attesting Officer*     Commissioner of Patents and Trademarks